United States Patent
Koenigsberger et al.

(10) Patent No.: US 7,656,033 B2
(45) Date of Patent: Feb. 2, 2010

(54) SEMICONDUCTOR DEVICE WITH A SEMICONDUCTOR CHIP USING LEAD TECHNOLOGY AND METHOD OF MANUFACTURING THE SAME

(75) Inventors: Alexander Koenigsberger, Regensburg (DE); Klaus Schiess, Allensbach (DE)

(73) Assignee: Infineon Technologies AG, Neubiberg (DE)

( * ) Notice: Subject to any disclaimer, the term of this patent is extended or adjusted under 35 U.S.C. 154(b) by 206 days.

(21) Appl. No.: 11/678,960

(22) Filed: Feb. 26, 2007

(65) Prior Publication Data

US 2007/0200250 A1 Aug. 30, 2007

Related U.S. Application Data

(63) Continuation of application No. PCT/DE2005/001462, filed on Aug. 18, 2005.

(30) Foreign Application Priority Data

Aug. 24, 2004 (DE) .................. 10 2004 041 088

(51) Int. Cl.
*H01L 23/495* (2006.01)
(52) U.S. Cl. .................. 257/736; 257/692; 257/773; 257/778; 257/781; 257/782; 257/E23.035; 257/E23.041
(58) Field of Classification Search ............... 257/736, 257/692, 781, 782, E23.035, E23.041
See application file for complete search history.

(56) References Cited

U.S. PATENT DOCUMENTS

| | | | | |
|---|---|---|---|---|
| 4,532,443 A | * | 7/1985 | Glennon | 327/404 |
| 5,554,561 A | * | 9/1996 | Plumton | 438/193 |
| 5,610,085 A | * | 3/1997 | Yuan et al. | 438/187 |
| 5,624,860 A | * | 4/1997 | Plumton et al. | 438/193 |
| 5,712,189 A | * | 1/1998 | Plumton et al. | 117/101 |
| 5,747,842 A | * | 5/1998 | Plumton | 257/266 |
| 5,889,298 A | * | 3/1999 | Plumton et al. | 257/285 |
| 6,040,626 A | * | 3/2000 | Cheah et al. | 257/735 |
| 6,097,046 A | * | 8/2000 | Plumton | 257/266 |
| 6,229,197 B1 | * | 5/2001 | Plumton et al. | 257/627 |
| 6,307,755 B1 | * | 10/2001 | Williams et al. | 361/813 |
| 6,479,888 B1 | * | 11/2002 | Hirashima et al. | 257/673 |
| 6,569,764 B1 | * | 5/2003 | Hirashima et al. | 438/673 |
| 6,720,642 B1 | * | 4/2004 | Joshi et al. | 257/673 |
| 6,762,067 B1 | * | 7/2004 | Quinones et al. | 438/11 |
| 6,774,466 B1 | * | 8/2004 | Kajiwara et al. | 257/673 |
| 6,867,489 B1 | * | 3/2005 | Estacio | 257/692 |
| 6,870,254 B1 | * | 3/2005 | Estacio et al. | 257/692 |

(Continued)

FOREIGN PATENT DOCUMENTS

DE 10134943 A1 10/2002

(Continued)

*Primary Examiner*—David Vu
*Assistant Examiner*—Earl N Taylor
(74) *Attorney, Agent, or Firm*—Edell, Shapiro & Finnan, LLC (57) ABSTRACT

A semiconductor device using lead technology includes a semiconductor chip with external side electrodes of semiconductor components disposed on its top side. On its rear side, the semiconductor chip is connected to a rear side internal lead adapted to the rear side of semiconductor chip. On its top side, the semiconductor chip is connected a plurality of top side internal leads. The top side internal leads are electrically connected to external leads of the semiconductor device.

10 Claims, 5 Drawing Sheets

U.S. PATENT DOCUMENTS

| | | | |
|---|---|---|---|
| 2001/0033022 A1* | 10/2001 | Ewer | 257/747 |
| 2001/0040277 A1* | 11/2001 | Lam et al. | 257/675 |
| 2001/0044167 A1* | 11/2001 | Kuo | 438/106 |
| 2002/0171126 A1* | 11/2002 | Estacio et al. | 257/666 |
| 2002/0179994 A1* | 12/2002 | Chen et al. | 257/500 |
| 2003/0062608 A1* | 4/2003 | Hamachi | 257/676 |
| 2003/0075786 A1* | 4/2003 | Joshi et al. | 257/676 |
| 2004/0063240 A1* | 4/2004 | Madrid et al. | 438/106 |
| 2004/0119118 A1* | 6/2004 | Williams et al. | 257/355 |
| 2004/0130009 A1* | 7/2004 | Tangpuz et al. | 257/666 |
| 2004/0130011 A1* | 7/2004 | Estacio et al. | 257/678 |
| 2004/0201081 A1* | 10/2004 | Joshi et al. | 257/666 |
| 2005/0001293 A1* | 1/2005 | Estacio | 257/666 |
| 2005/0012117 A1* | 1/2005 | Fukuhara | 257/202 |
| 2005/0023670 A1* | 2/2005 | Hata et al. | 257/690 |
| 2005/0048758 A1 | 3/2005 | Hosseini et al. | |
| 2005/0121784 A1* | 6/2005 | Standing | 257/737 |
| 2005/0218498 A1* | 10/2005 | Hata et al. | 257/690 |
| 2005/0272257 A1* | 12/2005 | Fuchs et al. | 438/643 |
| 2006/0017174 A1* | 1/2006 | Otremba | 257/778 |
| 2006/0138532 A1* | 6/2006 | Okamoto et al. | 257/328 |
| 2007/0040186 A1* | 2/2007 | Fillion et al. | 257/177 |

FOREIGN PATENT DOCUMENTS

| | | |
|---|---|---|
| EP | 0966038 A2 | 12/1999 |
| EP | 1357594 A1 | 10/2003 |
| WO | 0124260 A1 | 4/2001 |

* cited by examiner

SEMICONDUCTOR DEVICE WITH A SEMICONDUCTOR CHIP USING LEAD TECHNOLOGY AND METHOD OF MANUFACTURING THE SAME

CROSS REFERENCE TO RELATED APPLICATIONS

This application is a continuation of International Application No. PCT/DE2005/001462, filed on Aug. 18, 2005, entitled "Semiconductor Device Using Lead Technology Comprising a Semiconductor Chip," which claims priority under 35 U.S.C. §119 to Application No. DE 102004041088.7 filed on Aug. 24, 2004, entitled "Semiconductor Device Using Lead Technology Comprising a Semiconductor Chip," the entire contents of which are hereby incorporated by reference.

BACKGROUND

In the case of semiconductor devices using lead technology, the chip-specific resistance is continually being reduced by miniaturization of the structures of the semiconductor elements with their number simultaneously being increased, with the result that there is a need also to reduce the size of the connections and dimensions of the required housings, or packages, while at the same time reducing the "package resistance", both from an electrical standpoint and from a thermal standpoint.

Electronic power devices have been described which comprise a semiconductor chip having a plurality of MOS transistors. On the plurality of source electrodes, a corresponding plurality of thermocompression heads are bonded as so-called "stud bumps." Arranged on the stud bumps is a common connecting plate as source connection in the form of a prestressed clip.

This structure of the common source connection has the disadvantage that a tool is required for applying thermocompression heads, so that the distance between the connections cannot be decreased arbitrarily, or the number of connections to the source electrodes cannot be increased arbitrarily, in order to further reduce the "package resistance". Moreover, a clip construction has the further disadvantage of contact transition resistances. Furthermore, the structure has the disadvantage that a serial production method has to be used for the application of the plurality of source connections, which limits the throughput and impedes mass production.

Other methods use solder pastes on the active top side of the semiconductor chip for connecting gate internal leads and source internal leads to the corresponding electrodes of the semiconductor elements. These methods have the disadvantage that the distance between the common gate electrode and the source electrodes is limited and cannot be decreased further in order to ensure that the solder paste does not cause a short circuit in the course of sintering together. Moreover, on account of different solder thicknesses, the process implementation of solder pastes constitutes a risk with regard to tilting of the semiconductor chip and with regard to introduction of additional contaminants.

SUMMARY

A semiconductor device using lead technology includes a semiconductor chip with external side electrodes of semiconductor components disposed on its top side. On its rear side, the semiconductor chip is connected to a rear side internal lead adapted to the rear side of semiconductor chip. On its top side, the semiconductor chip is connected a plurality of top side internal leads. The top side internal leads are electrically connected to external leads of the semiconductor device. For example, a power semi-conductor device is configured to include a plurality of MOS structures connected in parallel on a semiconductor chip, in which source and gate electrodes are arranged on the active top side and a large-area drain electrode is arranged on the rear side.

The above and still further features and advantages of the semiconductor device and method of manufacturing the same will become apparent upon consideration of the following definitions, descriptions and descriptive figures of specific embodiments thereof, wherein like reference numerals in the various figures are utilized to designate like components. While these descriptions go into specific details of the semiconductor device and method, it should be understood that variations may and do exist and would be apparent to those skilled in the art based on the descriptions herein.

BRIEF DESCRIPTION OF THE DRAWINGS

The semiconductor device and method are explained in more detail below with reference to exemplary embodiments, where.

DETAILED DESCRIPTION

Described herein is a semiconductor device which overcomes the disadvantages and limits of known devices and further reduces the "package resistance" and also the "package size." Furthermore, a method of manufacturing the described device is described herein. The method enables an improved throughput in conjunction with a reduced reject rate.

The semiconductor device uses lead technology and comprises a semiconductor chip. The semiconductor chip includes top side electrodes of semiconductor elements on its top side and a large-area rear side electrode adapted to the rear side area on its rear side. The top side electrodes comprise pedestal-type flip-chip contacts with a multilayer construction and an identical pedestal height. In this case, the pedestal-type flip-chip contacts of the top side of the semiconductor chip are cohesively connected to top side internal leads which, for their part, are electrically connected to external leads.

A semiconductor device of this type has the advantage that it is not necessary to apply any bonding wires between the internal leads and chip contacts in a serial manner, rather the semiconductor chip includes pedestal-type flip-chip contacts with uniform pedestal height which, on the one hand, can be produced in a parallel method and, on the other hand, can be applied to internal leads of a leadframe using flip-chip technology. Moreover, the semiconductor device has the advantage of a small space requirement, which is not afforded in the case of customary flip-chip contacts nor is it possible in the case of stud bumps since these require a larger structural height than the pedestal height of the pedestal-type chip contacts according to the described device. Furthermore, the device has the advantage that the pedestal-type chip contacts can be brought as close to one another as desired without producing short circuits in the course of further processing, with the result that a higher yield is possible in production and the "package resistance" can be significantly reduced.

In particular, the semiconductor device is a power semiconductor device comprising a plurality of MOS transistors connected in parallel. For this purpose, the power semiconductor chip has a common gate electrode and a plurality of source electrodes on its top side. The plurality of source electrodes is connected in parallel by a common pedestal-type flip-chip contact. This pedestal-type source flip-chip contact has the same pedestal height as the common gate flip-chip contact, which is likewise arranged on the top side of the semiconductor chip.

Consequently, it is possible to cohesively connect the pedestal-type flip-chip contacts to corresponding internal leads in one method step. This cohesive connection can advantageously replace a connection clip which is otherwise customary and which connects the plurality of source electrodes with their stud bumps, or with their solder balls, in parallel with one another over a large area, the cohesive connection according to the described device simultaneously reduces the package resistance, especially as it is not necessary to overcome any contact transition resistances between the large-area clip electrode and the plurality of source connections.

The source flip-chip contact and the gate flip-chip contact comprise a multilayer construction in which the topmost layer is configured such that it supports the cohesive connection to the top side internal leads. In the case of a eutectic solder connection, for example, the topmost layer may be an aluminum layer comprising a source flip-chip contact as topmost layer, while the opposite top side internal lead, produced from copper, has a gold coating at a corresponding location in order then to enable a cohesive connection composed of a gold-aluminum eutectic.

In a second embodiment, the topmost layer on the pedestal-type source flip-chip contact may comprise the counter-component of a diffusion solder, with the result that intermetallic phases of a diffusion solder are formed upon joining together internal leads and pedestal-type source flip-chip contacts. Finally, it is also possible to use a solder paste, but the solder paste has a thickness in the submicron to micron range instead of the solder paste contacts which are employed in known devices and which are applied with a thickness of tens of micrometers and consequently increase the risk of short circuits during production. The thickness of the solder paste layer on the pedestal in the submicron to micron range ensures that a short circuit via the topmost cohesive connecting layer of adjacent contacts does not occur in the case of the semiconductor device.

Finally, the cohesive connection may also be achieved via a topmost layer on the pedestal-type source flip-chip contact and/or on the internal lead by application of a conductive adhesive layer. What is advantageously achieved via the multilayer construction is that the cohesive connecting layer has a smaller thickness than the pedestal height of the pedestal-type flip-chip contacts. A higher precision, a smaller spacing and a higher reliability are thus made possible by the semiconductor device.

In a further preferred embodiment, the rear side electrode or drain electrode is connected to a rear side internal lead having an areal extent adapted to the rear side electrode, wherein the rear side internal lead is connected to external leads. This is associated with the advantage that, on account of the large area, high electric currents can be conducted away from the semiconductor device via the rear side contact. On the other hand, this is also associated with the advantage that, in the case of a corresponding insulation of small thickness of the rear side electrode, for example via an insulation film, a high heat dissipation, e.g., to a heat sink, becomes possible since a thin film between a heat sink and the rear side of the semiconductor chip constitutes a minimal thermal resistance on account of the large-area nature of the electrodes.

Instead of an internal lead, the rear side electrode may also have a multilayer, pedestal-type rear side chip contact. The pedestal-type rear side chip contact may either project freely from the housing of a semiconductor device on its underside in order to have direct access to the rear side electrode of the semiconductor chip, or the pedestal-type rear side chip contact may be cohesively connected to an internal lead of corresponding size which leads to an external lead. Besides high current carrying, this large-area rear side connection can also account for a low package resistance, so that it is particularly well suited to power semiconductor devices.

The internal leads of a leadframe can also be prepared suitably prior to the assembly of a semiconductor device, so that the semiconductor device has internal leads having pedestal-type, multilayer connection contacts which are cohesively connected to the pedestal-type chip contacts. Although this requires a higher outlay in the production of the leadframes, especially as each internal lead has to have corresponding pedestal-type chip contacts, it also has the advantage that, by virtue of the multilayer nature, this pedestal already has corresponding components for diffusion soldering, for eutectic soldering or for corresponding adhesive-bonding connection. A double-sided adhesive film having a thin layer of adhesive on both sides of a conductive film core is particularly suitable for such an adhesive-bonding connection. The layers of adhesive on both sides of the electrically conductive film core have a thickness in the submicron range and can be adhesively bonded very precisely onto the pedestal-type components to be connected.

It is furthermore provided that internal leads which are cohesively connected to the top side chip electrodes have a transition region to the external leads within the semiconductor device. The transition region is configured in such a way that the external leads for the top side internal leads and for the rear side internal leads are arranged on a common external connection level of the semiconductor device. This has the advantage that externally it cannot be discerned that here two leadframes are arranged one above the other and the semiconductor chip is fixed between the two leadframes by its pedestal-type contacts using flip-chip technology. All that remain of the two leadframes, however, are the internal leads in conjunction with their external leads, in which case, by virtue of the transition region within the semiconductor housing, the internal leads for the top side of the semiconductor chip undergo transition to the common external connection level of the external contacts. This also facilitates the mounting of the semiconductor device on a superordinate electronic circuit.

A method for producing a semiconductor device using lead technology comprising a semiconductor chip includes the following method steps. The first step involves producing a semiconductor chip with electrodes of semiconductor elements on its top side and a large-area rear side electrode on its rear side, the areal extent of which corresponds to the size of the rear side. This production is normally effected in the context of a semiconductor wafer comprising a plurality of semiconductor chip positions in rows and columns, which are separated into individual semiconductor chips after the individual production steps via a corresponding sawing technique. The next step for producing a semiconductor device, namely the application of pedestal-type flip-chip contacts to the electrodes of the top side, can also be realized simultaneously for a plurality of semiconductor chips on a non-separated semiconductor wafer in a plurality of semiconductor device positions.

For the application of the pedestal-type structures, the semiconductor wafer is subjected to a deposition method of metal layers. The pedestal height is determined by the deposition rate and by the time duration of the deposition method. In order to achieve a high precision, during the deposition method, the entire wafer is provided with a sequence of metal layers and this closed metal layer is subsequently patterned into individual pedestal-type flip-chip contacts in a photolithographic method, associated with wet etching or dry plasma etching.

The semiconductor chips are subsequently connected by their pedestal-type flip-chip contacts on their top side to internal leads of a leadframe.

In one exemplary implementation of the production method, a further leadframe with internal leads is available in order to connect the rear side electrode of the semiconductor chip. Instead of a further leadframe, however, it is also possible to apply a heat sink or a large-area, pedestal-type chip contact to the rear side electrode. The cohesive connection of the rear side electrode to a rear side internal lead of a further leadframe or to a heat sink or application of a pedestal-type chip contact is carried out after the top side flip-chip contacts have already been connected to internal leads. After internal leads have been fitted both on the top side and on the underside of the semi-conductor chip, the internal leads being connected to corresponding external leads, these components are then packaged in a plastic housing. In this case, the internal leads may be covered only with an insulation film, while the remaining components are enveloped in a plastic housing composition. On the other hand, it is also provided that a metal block as heat sink or a pedestal-type rear side chip contact remains freely accessible during the packaging of the components.

This method has the advantage of using neither bonding wires, nor solder balls, nor stud bumps, which are limited in the minimization of their space requirement. A further advantage is that the pedestal-type chip contacts can be fitted both on the top side and on the underside in a parallel production method. Furthermore, it is advantageous that this application of the pedestal contacts may already be carried out on a semi-conductor wafer having a plurality of rows and columns of semiconductor device positions. For the deposition of the pedestal-type flip-chip contacts, both on the top side and on the rear side, it is advantageously possible to carry out an electro deposition method of the metal of the pedestals. In this case, the pedestal height is determined by the deposition rate and the deposition time. On the other hand, different metal layers can be produced by successively providing different electroplating baths.

Pedestal heights of between 1 and 20 µm (micrometers) are preferably set during the electro deposition. In this case, it is possible to deposit copper and in turn to deposit nickel on the copper, in order to realize a diffusion barrier to the next layer, namely the layer which is intended to produce the cohesive connection to the internal leads. The topmost layer of the pedestal may comprise gold or aluminum, for example, for a eutectic connection to the internal lead. A titanium layer may also be incorporated as a diffusion barrier in order to prevent copper from indiffusing into the upper layer of the pedestal-type flip-chip contacts that is intended for a eutectic alloy or for a diffusion solder alloy.

The metal layers for the pedestal-type flip-chip contacts may also be produced via a metal vapor deposition method. In this case, a closed metal layer or a closed layer sequence is vapor-deposited onto the rear side and/or onto the top side of a semiconductor wafer and is subsequently patterned with the aid of a mask technology or a photolithography technique. Dry etching methods such as plasma etching or wet etching methods which are coordinated with the respective metal material may be used for patterning. This method has the advantage that extremely precisely delimited structures become possible. At the same time, the method has the advantage that the hitherto smallest horizontal distances between two flip-chip contacts can thereby be realized.

A closed metal layer or a closed metal layer sequence can also be effected with the aid of a chemical vapor deposition, the metals being fed in the form of organometallic compounds to a reactor and the organometallic compounds decomposing into metals and volatile organic substances in the reactor, with the result that the metals can deposit on the semiconductor wafer to be coated.

A further possibility for applying pedestal-type flip-chip contacts to a semiconductor wafer, or a semiconductor chip, is afforded by the so-called printing methods. One of the printing methods is of particular interest in this case, namely the jet printing method, in which the metal structure is written on the semiconductor wafer in a manner similar to that in an inkjet printer. Parallel printing methods, such as screen printing or stencil printing, can likewise be used if the distances between the flip-chip contacts are noncritical.

Preferably, an adhesive bonding method with a corresponding conductive adhesive is used for the cohesive connection of the pedestal-type chip contacts to internal leads of a leadframe. This has the advantage that conductive adhesives cure at a relatively low temperature, with the result that there is no risk of the semiconductor devices being thermally overloaded during production.

Finally, the components can be embedded into a housing plastic composition, the various housing forms being possible. On the one hand, the plastic composition can encapsulate the components in such a way that only the external contacts which are connected to the top side internal leads and to the rear side internal leads project from the plastic housing. On the other hand, the rear side contact can be formed such that it forms a large-area external contact in which a pedestal-type rear side chip contact projects from the plastic housing composition on the underside of the semiconductor device, whereby direct access to the rear side electrode of the semiconductor chip is possible.

Furthermore, the plastic housing can be configured in such a way that a heat conducting block projects from the plastic housing composition, the heat conducting block for its part comprising cooling fins and being insulated from the rear side contact of the semiconductor chip by a thin insulation film. On the other hand, the heat conducting block can also be electrically connected cohesively to the rear side contact of the semiconductor chip and therefore fulfill two functions simultaneously, namely a contact which can be put at the lowest circuit potential and, on the other hand, a heat dissipater which can emit the heat to the surroundings.

Finally, in the construction of a preferred semiconductor, the encapsulation by a plastic composition can be completely dispensed with by covering the internal leads of the top side and/or the internal leads of the underside with an insulating film. It is also possible to provide a type of mixed design for the housing in which first the components are only partly embedded in a plastic composition and the internal leads are covered at least in their regions with a film as external insulation. Such a film covering method makes it possible for the thickness of the semiconductor devices to be extremely minimized, on the one hand, and for the production costs to be reduced to a minimum, on the other hand.

To summarize, it can be established that different manufacturing sequences may lead to the semiconductor device. For this purpose, firstly the top side of a semiconductor chip, the top side having contact areas, is coated with a patterned metal layer, for example composed of a copper alloy, with a height of 20 µm as a pedestal. This thickness is essentially determined by the viscosity of the plastic housing composition that is to be applied later. Individual metal layers are then deposited on electrically conductive pedestals of this type, in order to be able to produce a solderable or cohesive connection to internal leads.

The material of the metal layers depends on whether diffusion soldering, eutectic soldering or deposit soldering is involved. Moreover, for a cohesive connection of this type, adhesively bondable contact areas may be formed on the pedestal-type chip contacts. It is also possible to prepare the rear side of the semiconductor chip for a soldering process by applying either solder paste or materials for diffusion soldering or for eutectic soldering or a conductive adhesive film to the rear side electrode.

A first step involves connecting the chip contacts on the chip top side to a leadframe via flip-chip technology. In a further step, the leadframe with the fitted semiconductor chips is turned over onto its rear side, so that the rear side of the semiconductor chip with a solder paste or a conductive adhesive is then available for an application of a further rear side internal lead. Instead of a further internal lead, it is also possible to apply a metal block as heat sink to the semiconductor chip rear side. In that case it is not necessary to provide a further leadframe.

Finally, a semiconductor device prepared in this way is then encapsulated by molding in a next step, wherein the top contacts are completely encapsulated by molding or the top contacts project from the package and are electrically protected only by an insulating film. In this case, one aim is to choose the electrical insulation to be as thin as possible in order that the thermal resistance with respect to the surroundings is kept low. On the other hand, it is possible to permit only the chip rear side to project from the plastic housing, without an internal lead or a heat sink being applied on the rear side. Consequently, the construction of a novel semiconductor device has the advantage that it is possible to realize many different housing forms which, however, all have an improved package resistance.

To summarize, the follow advantages are among those provided by the invention.

1. The metal layer of the pedestal-type flip-chip contacts on the top side of the semiconductor chip leads to a minimum distance between chip top side and the lead. This on the one hand prevents damage on account of a molding filler that is perhaps required, which may occur during the stress test of the devices. On the other hand, the additional metal area of the pedestal can be used as a thermal buffer. In addition, there is a reduction of the electrical shunt resistance on account of the areal cross-sectional enlargement.

2. The connection of the top contacts via eutectic soldering or diffusion soldering permits a reduction of the minimum distances between the contact areas. This is advantageous in order to be able to process even small chips via a lead technology and consequently to obtain the advantage of a low package resistance. Furthermore, this arrangement enables a greater tolerance leeway since the cohesive lead area does not constitute a limiting factor, as in the case of bonding wires or in the case of solder balls or in the case of stud bumps.

3. A further advantage is the uniform footprint for different chip sizes. This is advantageous primarily for the end customer since the latter can use only one footprint for different products.

In the following paragraphs, exemplary embodiments of the semiconductor device and method of manufacturing the same are described in connection with the figures.

Figure 1:
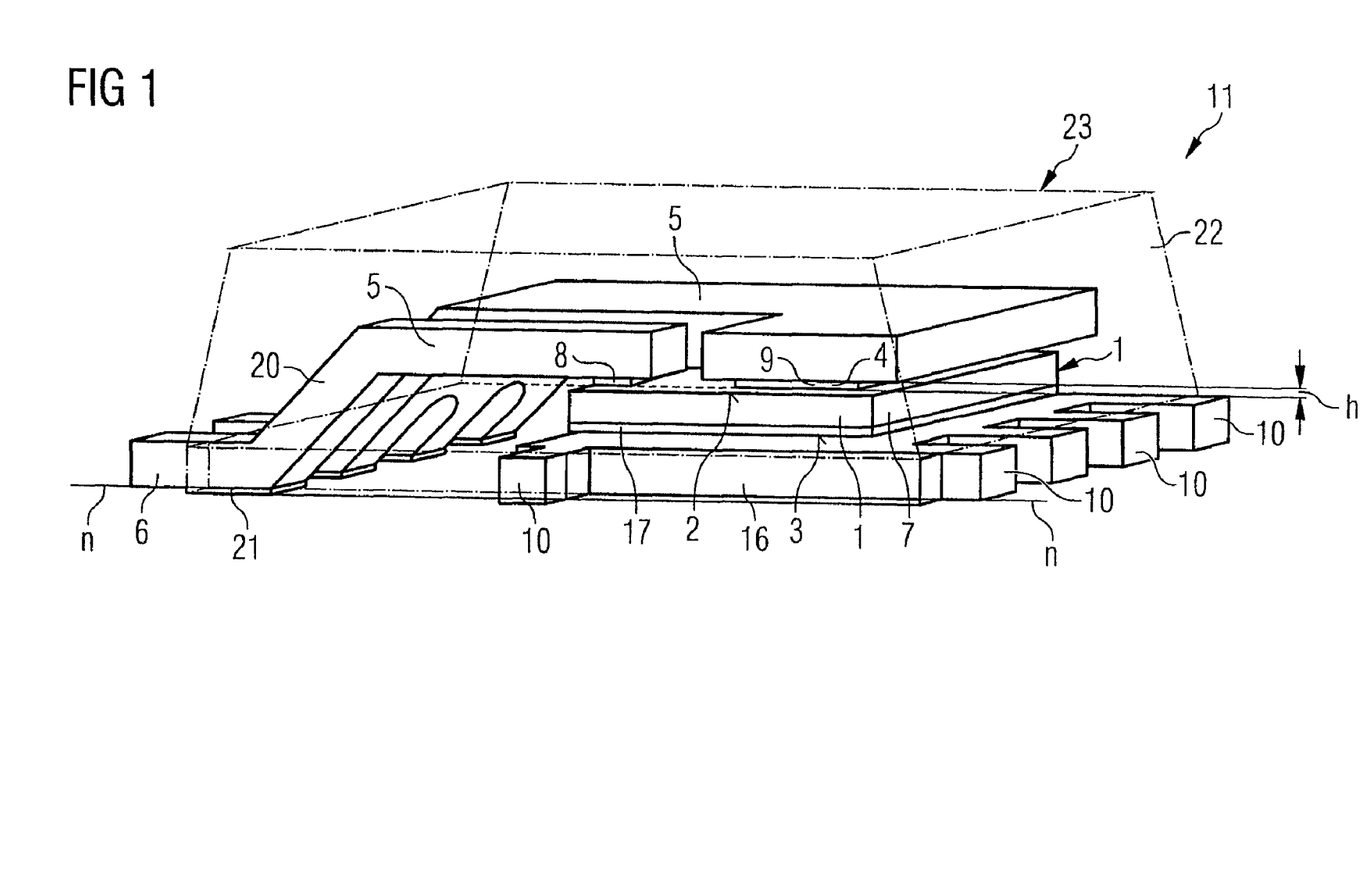
FIG. 1 shows a basic perspective view of a semiconductor device in accordance with a first embodiment.

FIG. 1 shows a basic perspective view of a first embodiment of the semiconductor device 11. This semiconductor device 11 is embodied using lead technology, external leads 6 and 10 forming a common external connection level n in this embodiment of the invention. The external leads 6 and 10 nevertheless do not belong to an identical leadframe, but rather are stamped out from two different leadframes. The external leads 6 are connected to top side internal leads 5 connected to top side contacts of a semiconductor chip 1. The external leads 10 are connected to internal leads 16 and to the rear side contact of the rear side 3 of the semiconductor chip 1. In this case, the areal extent of the rear side internal lead 16 corresponds to the area of the rear side 3 of the semiconductor chip 1.

On the top side 2 of the semiconductor chip 1, by contrast, a plurality of internal leads are cohesively connected to electrodes of the active top side 2 of the semiconductor chip 1. In this first embodiment, the semiconductor chip 1 is a power semiconductor chip 7, which switches high currents via a plurality of MOS transistors from the top side 2 of the power semiconductor chip 7 to the underside 3 of the power semiconductor chip 7. For this purpose, on the top side 2, the plurality of source electrodes are connected via a common pedestal-type source flip-chip contact 9 having a pedestal height h of 20 µm (micrometers), for example. Moreover, the top side 2 has a common gate flip-chip contact 8 formed in pedestal-type fashion.

The pedestal-type flip-chip contacts 4 are connected via a transition region 20 to the external leads 6 arranged at the external connection level n. The transition region 20 overcomes the height difference between the top side 2 of the semiconductor chip 1 and the rear side 3 of the semiconductor chip 1. The pedestal-type flip-chip contact areas 8 and 9 on the top side 2 of the semiconductor chip 1 on the one hand produce a large-area connection to the top side internal leads 5 on the top side 2 of the semiconductor chip 1, and on the other hand provide a reliable connection to the external leads 6. In this embodiment of the invention, the rear side 3 of the semiconductor chip 1 also has a pedestal-type chip contact 17, which is arranged in large-area fashion on the rear side 3 of the semiconductor chip 1 and is cohesively connected to the underlying large-area rear side internal lead 16. The rear side internal lead 16 undergoes transition, outside the plastic housing 23, to four external lead areas 10, which are all at the same external potential, however, while the top side internal leads 5 undergo transition, on the top side 2 of the semiconductor chip 1, to external leads 6 which impart a gate contact 8, on the one hand, and constitute a common source contact 9, on the other hand.

During the production of a semiconductor chip 1 of this type, first the semiconductor chip 1 is fixed with its pedestal-type flip-chip contacts 4 on the top side internal leads 5 for the top side 2 of the semiconductor chip 1 in order to populate a first leadframe with semiconductor chips 1. The leadframe is then turned over, so that a rear side electrode of the semiconductor chip 1 can be connected to corresponding internal leads 16 from above. After this joining together of internal leads 16 which are formed by two different leadframes and are connected via the semiconductor chip 1, it is then possible to produce the plastic housing 23 made from a housing plastic composition 22 via an injection-molding process. In order to insulate the underside of the internal leads, the underside can be covered with an insulation film 21.

Figure 2:
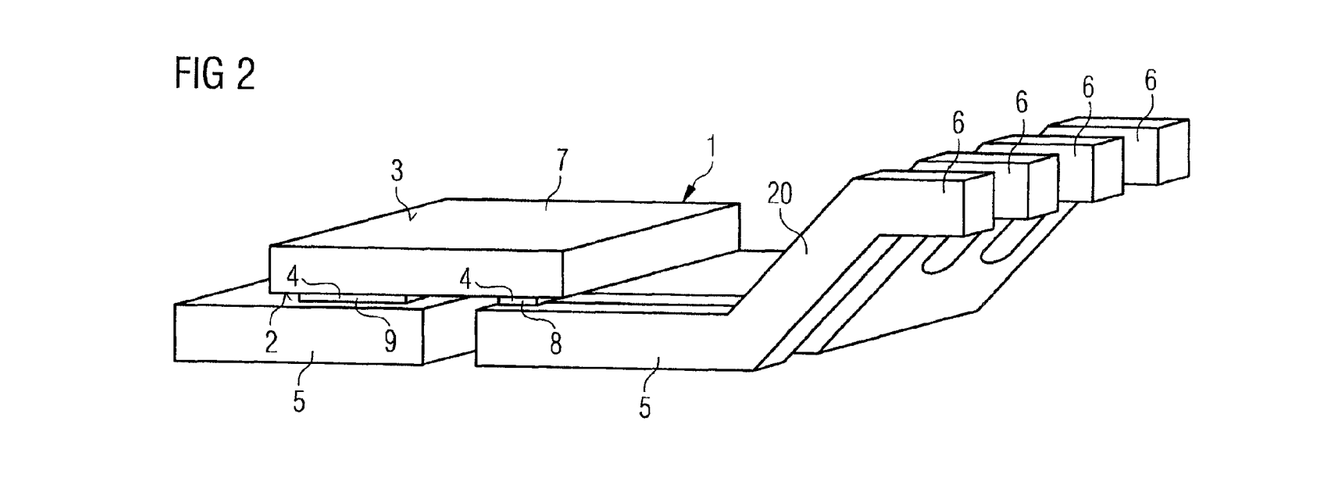
FIG. 2 shows a basic perspective view of an intermediate product in the production of the semiconductor device in accordance with FIG. 1.

FIG. 2 shows a basic perspective view of an intermediate product in the production of the semiconductor device in accordance with FIG. 1. Components having the same functions as in FIG. 1 are identified by the same reference symbols and are not discussed separately.

FIG. 2 shows a detail from a first leadframe including leads 5, which are connected, on the one hand, to a pedestal-type gate flip-chip contact 8 and to a further pedestal-type source flip-chip contact 9. The pedestal-type source flip-chip contact 9 forms a common contact for a plurality of source electrodes on the active top side 2 of the semiconductor chip 1. In order to apply a large-area internal lead to the rear side 3 of the semiconductor chip 1, the first leadframe is rotated through 180°, with semiconductor chips 1 that have already been fixed.

Figure 3:
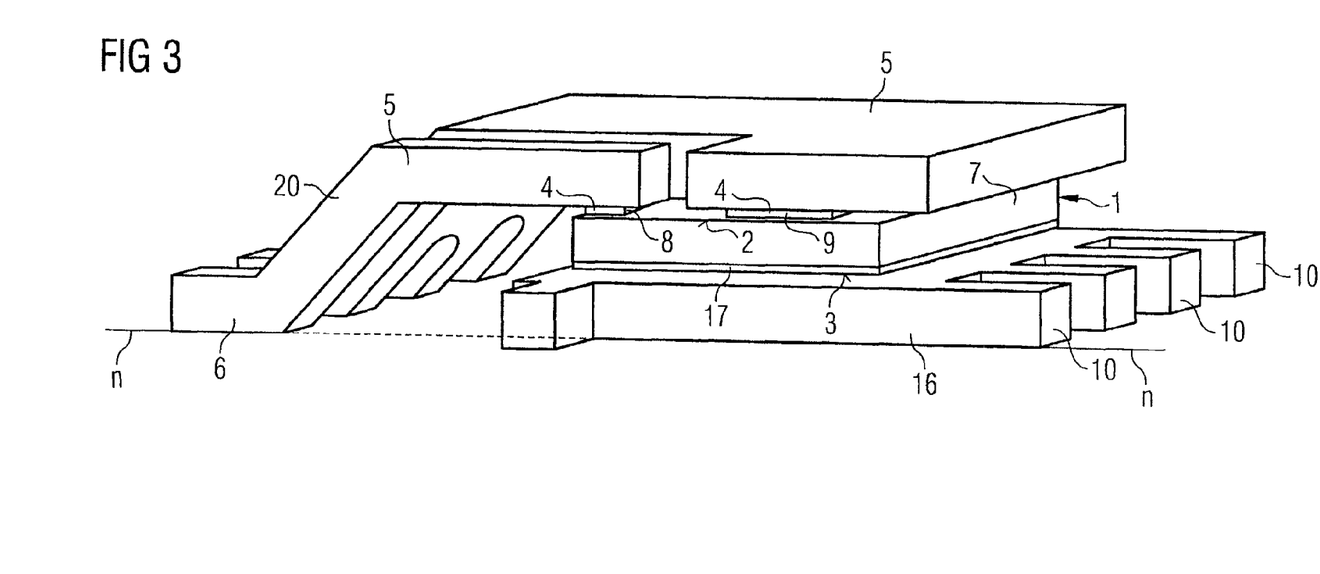
FIG. 3 shows a basic perspective view of a further intermediate product in the production of the semiconductor device in accordance with FIG. 1.

FIG. 3 shows a basic perspective view of a further intermediate product in the production of the semiconductor device 11 in accordance with FIG. 1. This involved making available a further leadframe with a rear side internal lead 16, which is electrically connected to external leads 10. The rear side electrode of the semiconductor chip 1 is cohesively connected to the rear side internal lead 16 via a pedestal-type rear side chip contact 17. To complete the semiconductor device 111 shown in FIG. 1, all that is then lacking is just the embedding of these components into a housing plastic composition 22 as shown in FIG. 1.

Figure 4:
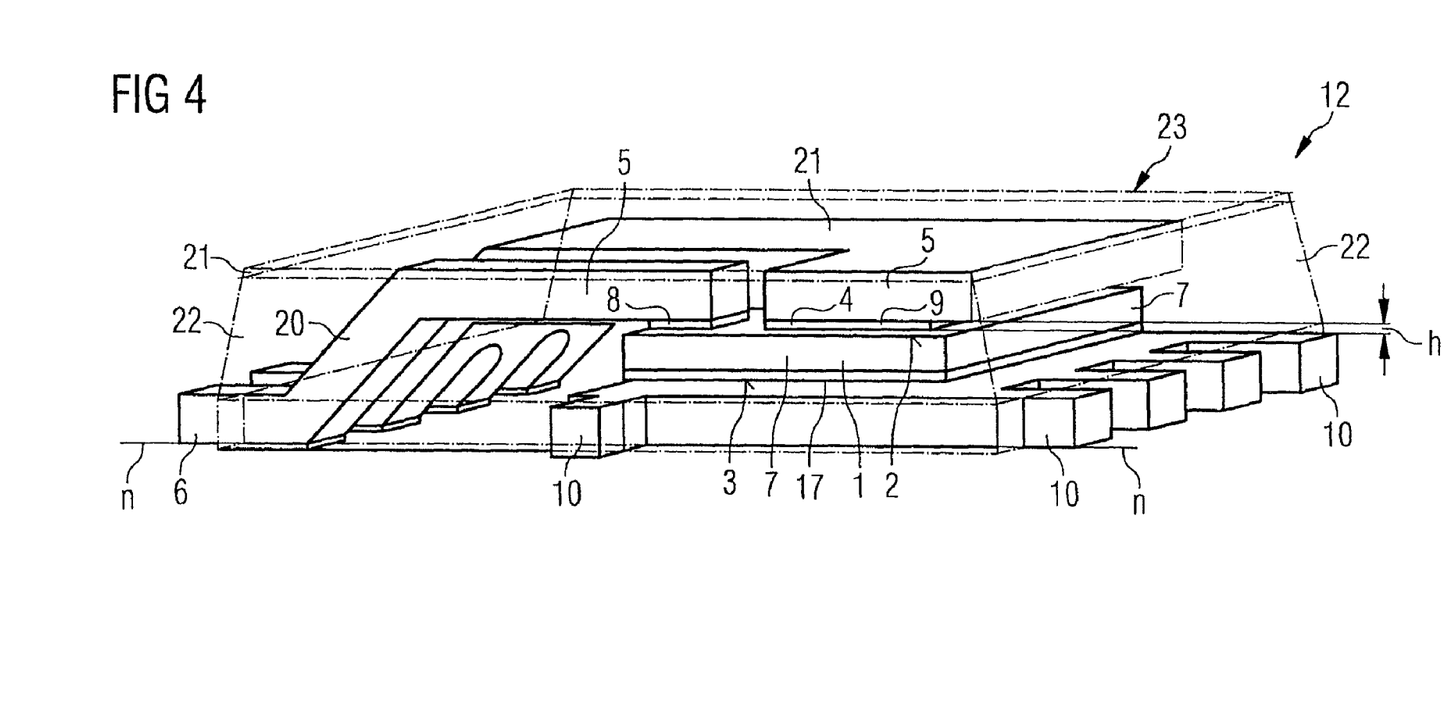
FIG. 4 shows a basic perspective view of a semiconductor device in accordance with a second embodiment.

FIG. 4 shows a basic perspective view of a second embodiment of the semi-conductor device 12. The semiconductor device 12 differs from the first embodiment in accordance with FIG. 1 by virtue of the fact that an insulation film 21 covers the top side internal leads 5 and forms a part of the semiconductor device housing made from a housing plastic composition 22. The rest of the structure of the second embodiment in accordance with FIG. 4 corresponds to the version shown in FIG. 1. The application of the thin insulation film 21 makes it possible for the heat transfer to a heat sink to be kept low, compared with the first embodiment in accordance with FIG. 1.

Figure 5:
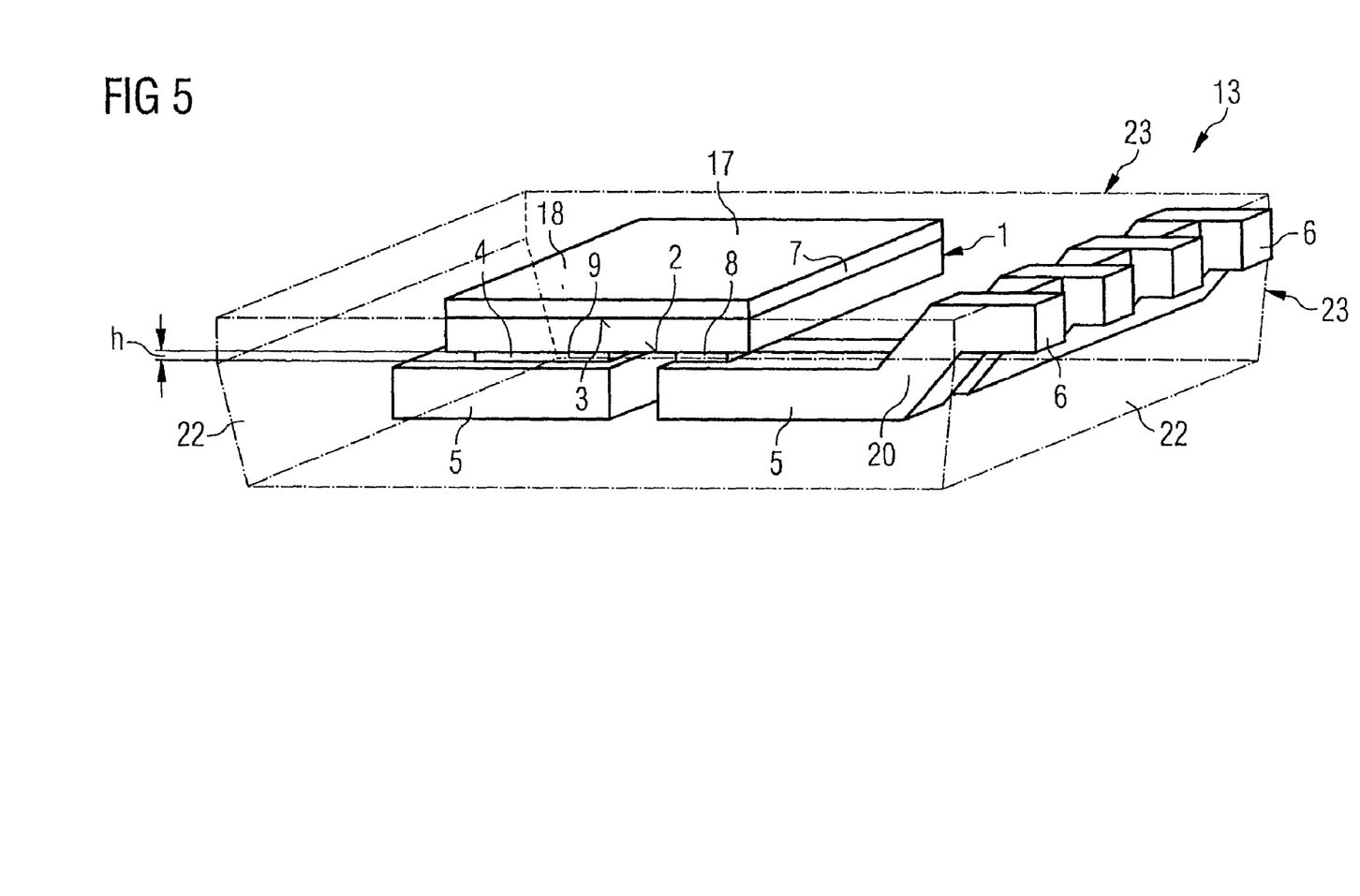
FIG. 5 shows a basic perspective view of a semiconductor device in accordance with a third embodiment.

FIG. 5 is a basic perspective view of a third embodiment of the semiconductor device 13. Components having the same functions as in previous figures are identified by the same reference symbols and are not discussed separately.

A difference of the third embodiment in accordance with FIG. 5 was brought about by the application of a pedestal-type chip rear side contact 17 to the rear side 3 of the semiconductor chip 1. The pedestal-type rear side chip contact 17 then projects from the underside of the semiconductor device 13, thereby ensuring reliable access externally. The second leadframe as is additionally required for the device shown in FIG. 1 is obviated in this embodiment. Furthermore, one advantage of this embodiment is that the rear side contact of the semiconductor chip 1 can be directly accessed via the pedestal-type rear side chip contact 17 of the rear side 3.

Figure 6:
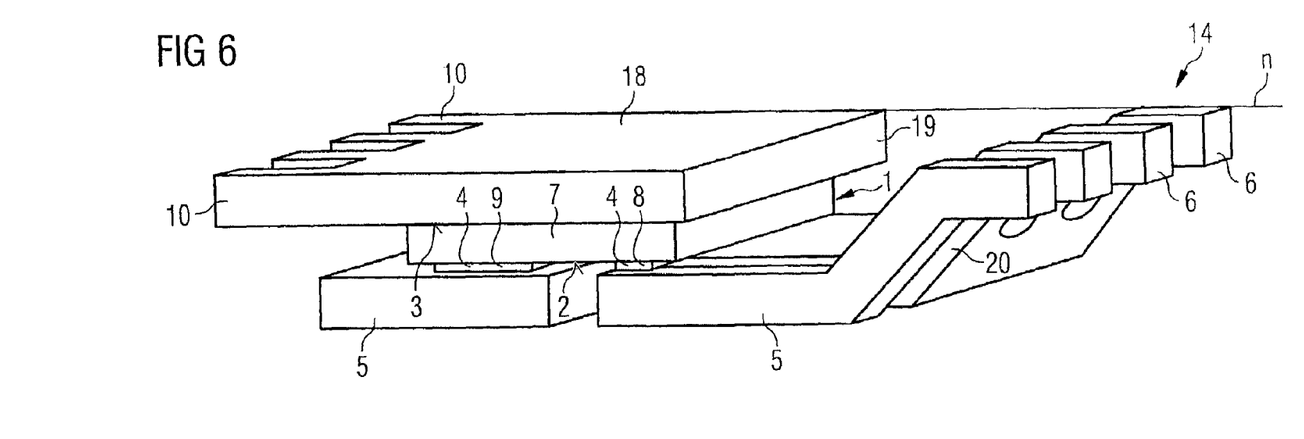
FIG. 6 shows a basic perspective view of a semiconductor device in accordance with a fourth embodiment.

FIG. 6 shows a basic perspective view of a fourth embodiment of the semi-conductor device 14. This embodiment corresponds to FIG. 3 shown above in terms of its construction. The rear side internal lead 16 has merely been replaced by a metal block 18 as heat sink 19. This embodiment has the advantage that the rear side 3 of the semiconductor chip 1 can now be intensively cooled in order that the heat loss during the switching of the power semiconductor chip 7 is dissipated directly.

Figure 7:
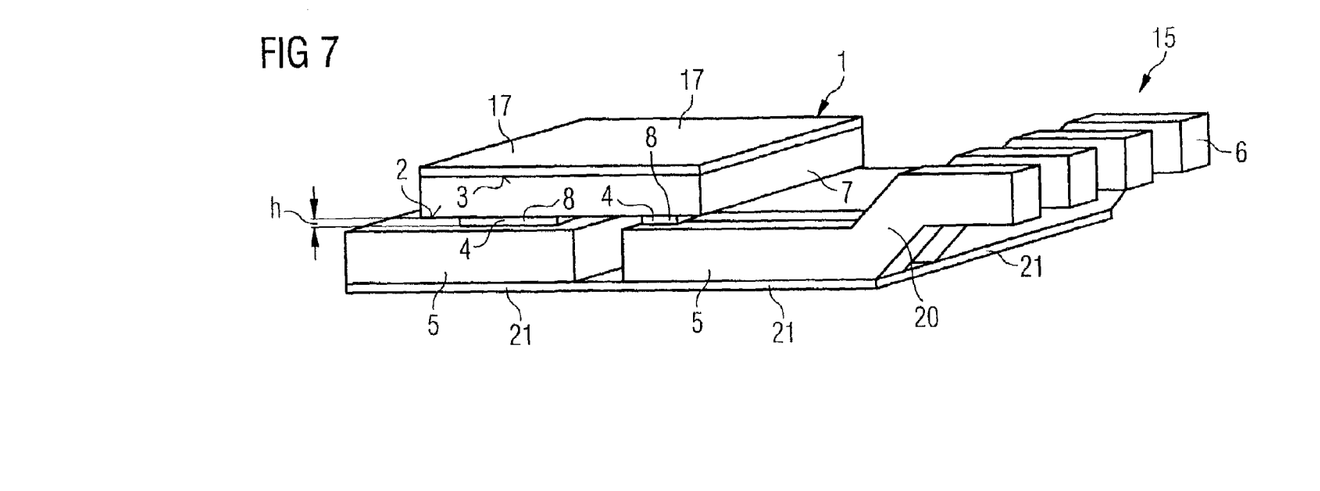
FIG. 7 shows a basic perspective view of a semiconductor device in accordance with a fifth embodiment.

FIG. 7 shows a basic perspective view of a fifth embodiment of the semiconductor device 15. In this embodiment, the semiconductor chip 1 has a rear side contact which is completely covered with a pedestal-type rear side chip contact 17. Moreover, the top side internal leads 5, on the top side 2, have an additional insulating film 21 in order to protect the top side internal leads 5 against short circuits.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor device using lead technology comprising:
   a semiconductor chip including:
      a plurality of MOS transistors connected in parallel;
      a common gate electrode of the MOS transistors, the common gate electrode being disposed on a top side of the semiconductor chip and comprising a pedestal-type gate flip-chip contact with a multilayer construction;
      a plurality of source electrodes of the MOS transistors and a single, common pedestal-type source flip-chip contact with a multilayer construction, the source electrodes being disposed on the top side of the semiconductor chip and being connected in parallel by the single, common pedestal-type source flip-chip contact, wherein a pedestal height of the source flip-chip contact is substantially identical to a pedestal height of the gate flip-chip contact; and
      a large-area rear side electrode adapted to an area of a rear side of the semiconductor chip;
   a housing;
   a plurality of top side external leads that protrude from the housing; and
   a plurality of top side internal leads within the housing and electrically connected to the top side external leads, wherein the gate and source flip-chip contacts are cohesively connected to the top side internal leads.

2. The semiconductor device as claimed in claim 1, wherein the large-area rear side electrode is a drain electrode.

3. The semiconductor device as claimed in claim 1, further comprising:
   a rear side internal lead connected to the rear side electrode, wherein an areal extent of the rear side internal lead is adapted to the rear side electrode; and
   a plurality of rear side external leads connected to the rear side internal lead.

4. The semiconductor device as claimed in claim 3, wherein the rear side electrode further comprises:
   a multilayer pedestal-type rear side chip contact cohesively connected to the rear side internal lead.

5. The semiconductor device as claimed in claim 4, wherein the semiconductor chip is arranged in the semiconductor device such that the rear side electrode with the pedestal-type chip contact is freely accessible.

6. The semiconductor device as claimed in claim 4, wherein the rear side electrode further comprises:

a metal block with an areal extent adapted to the rear side electrode, the metal block being a heat sink.

7. The semiconductor device as claimed in claim 4, wherein the top side and rear side internal leads further comprise:

pedestal-type multilayer connection contacts cohesively connected to the gate, source, and rear-side pedestal-type contacts of the semiconductor chip.

8. The semiconductor device as claimed in claim 3, wherein the top side internal leads further comprise:

a transition region between the top side internal and external leads, the transition region being configured such that the rear side external leads and the top side external leads are arranged on a common external connection level of the semiconductor device; and wherein the top side internal leads are cohesively connected to the gate and source electrodes.

9. The semiconductor device as claimed in claim 1, wherein the source and gate contacts comprise a cohesive connection including at least one of: a conductive adhesive connection, a diffusion soldering connection, a eutectic soldering connection, a conductive adhesive film, and a solder paste connection.

10. The semiconductor device of claim 1, wherein the pedestal heights of the gate and source flip-chip contacts are between 1 and 20 µm.

* * * * *